US011036145B2

(12) United States Patent
Chadha et al.

(10) Patent No.: US 11,036,145 B2
(45) Date of Patent: Jun. 15, 2021

(54) LARGE AREA SELF IMAGING LITHOGRAPHY BASED ON BROADBAND LIGHT SOURCE

(71) Applicant: Applied Materials, Inc., Santa Clara, CA (US)

(72) Inventors: Arvinder Chadha, San Jose, CA (US); Kevin Laughton Cunningham, Belmont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 15 days.

(21) Appl. No.: 16/230,667

(22) Filed: Dec. 21, 2018

(65) Prior Publication Data

US 2020/0201186 A1 Jun. 25, 2020

(51) Int. Cl.
*G03F 7/20* (2006.01)

(52) U.S. Cl.
CPC ........ *G03F 7/70408* (2013.01); *G03F 7/2006* (2013.01); *G03F 7/7005* (2013.01); *G03F 7/70191* (2013.01)

(58) Field of Classification Search
CPC . G03F 7/2006; G03F 1/36; G03F 1/14; G03F 1/26–34; G03F 7/70191; G03F 7/70283; G03F 7/703; G03F 7/70325; G03F 7/70375; G03F 7/70408; G03F 7/7035; G03F 7/70466; G03F 7/70058; G03F 7/7005; G03F 7/70091; G03F 7/70141; G03F 7/70158; G03F 7/70208; G03F 7/7045; G03F 7/70458; G03F 7/70733;
(Continued)

(56) References Cited

U.S. PATENT DOCUMENTS 3,776,633 A * 12/1973 Frosch .................. G02B 27/58
355/132
5,413,884 A 5/1995 Koch et al.
(Continued)

FOREIGN PATENT DOCUMENTS

JP 2009103786 A 5/2009
JP 2011165080 A 8/2011
(Continued)

OTHER PUBLICATIONS

International Search Report / Written Opinion issued to PCT/US2019/065053 dated Mar. 27, 2020.

*Primary Examiner* — Christina A Riddle
(74) *Attorney, Agent, or Firm* — Patterson + Sheridan LLP (57) ABSTRACT

Embodiments described herein provide a method of large area lithography to decrease widths of portions written into photoresists. One embodiment of the method includes projecting an initial light beam of a plurality of light beams at a minimum wavelength to a mask in a propagation direction of the plurality of light beams. The mask has a plurality of dispersive elements. A wavelength of each light beam of the plurality of light beams is increased until a final light beam of the plurality of light beams is projected at a maximum wavelength. The plurality of dispersive elements of the mask diffract the plurality of light beams into order mode beams to produce an intensity pattern in a medium between the mask and a substrate having a photoresist layer disposed thereon. The intensity pattern having a plurality of intensity peaks writes a plurality of portions in the photoresist layer.

20 Claims, 10 Drawing Sheets

(58) Field of Classification Search
CPC ............. G03F 7/70775; G03F 7/70341; G03F 7/70416
USPC ............... 355/39, 46, 50, 52–55, 67–72, 77; 359/485.01, 485.05; 250/492.1, 492.2, 250/492.22, 493.1, 494.1, 503.1, 504 R; 430/5
See application file for complete search history.

(56) References Cited

U.S. PATENT DOCUMENTS

| | | | |
|---|---|---|---|
| 5,715,039 A * | 2/1998 | Fukuda | G03F 7/70316 355/53 |
| 2002/0015919 A1 * | 2/2002 | Kristensen | G02B 6/02109 430/321 |
| 2002/0180941 A1 * | 12/2002 | Hansen | G03F 7/7035 355/53 |
| 2008/0143987 A1 * | 6/2008 | Uemura | G03B 27/54 355/67 |
| 2010/0279233 A1 | 11/2010 | Kim et al. | |
| 2017/0371251 A1 | 12/2017 | Hetzler et al. | |

FOREIGN PATENT DOCUMENTS

| | | | | |
|---|---|---|---|---|
| WO | WO-0057236 A3 * | 1/2001 | ......... | G03F 7/70408 |
| WO | WO-2009051366 A1 * | 4/2009 | ......... | G03F 7/70408 |

* cited by examiner

LARGE AREA SELF IMAGING LITHOGRAPHY BASED ON BROADBAND LIGHT SOURCE

BACKGROUND

Field

Embodiments of the present disclosure generally relate to lithography. More particularly, embodiments of the present disclosure relate to a method of large area lithography.

Description of the Related Art

Lithography is widely used in the manufacturing of optical components and waveguide structures used in display devices, such as flat panel displays. Large area substrates are often utilized in the manufacture flat panel displays. In one example, flat panel displays are commonly used for active matrix displays, such as computers, touch panel devices, personal digital assistants (PDAs), cell phones, television monitors, and the like.

Conventional lithography of large area substrates includes projecting light beams to a mask. The mask receives the light beams and diffracts the light beams to produce an intensity pattern. Peaks of the intensity pattern write a plurality of portions having sub-micro widths into a photoresist disposed over a substrate positioned under or after the mask. The exposed photo resist can be etched using standard semiconductor processes to transfer pattern onto a rigid or flexible substrate, thin films or waveguides. The widths of the portions correspond to the critical dimension of the features that enable functionality critical to flat panel displays. However, there are demands and device trends for features having widths not obtainable by conventional lithographic processes. Accordingly, what is needed in the art are improved methods of lithography that enable large area sub-micron patterning of critical dimensions with high throughput and efficiency at low cost.

SUMMARY

In one embodiment, a method is provided. The method includes projecting a first light beam of a plurality of light beams to a mask in a propagation direction of the plurality of light beams. The mask has a plurality of dispersive elements, and the first light beam has a first polarization of one of a transverse electric (TE) polarization, a transverse magnetic (TM) polarization, and an partial polarization. A second light beam of the plurality of light beams is projected to the mask. The second light beam has a second polarization of one of the TE polarization, the TM polarization, and the partial polarization, and the second polarization is different than the first polarization. The plurality of dispersive elements of the mask diffract the plurality of light beams into order mode beams to produce an intensity pattern in a medium between the mask and a substrate having a photoresist layer disposed thereon. The intensity pattern having a plurality of intensity peaks writes a plurality of portions in the photoresist layer.

In another embodiment, a method is provided. The method includes projecting an initial light beam of a plurality of light beams at a minimum wavelength to a mask in a propagation direction of the plurality of light beams. The mask has a plurality of dispersive elements. A wavelength of each light beam of the plurality of light beams is increased until a final light beam of the plurality of light beams is projected at a maximum wavelength. The plurality of dispersive elements of the mask diffract the plurality of light beams into order mode beams to produce an intensity pattern in a medium between the mask and a substrate having a photoresist layer disposed thereon. The intensity pattern having a plurality of intensity peaks writes a plurality of portions in the photoresist layer.

In yet another embodiment, a method is provided. The method includes projecting a plurality of light beams concurrently to a mask in a propagation direction of the plurality of light beams. Each light beam of the plurality of light beams has a different wavelength not less than a minimum wavelength and not greater than a maximum wavelength of a plurality of wavelengths. A plurality of dispersive elements of the mask diffract the plurality of light beams into order mode beams to produce an intensity pattern in a medium between the mask and a substrate having a photoresist layer disposed thereon. The intensity pattern having a plurality of intensity peaks writes a plurality of portions in the photoresist layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a method of large area lithography to decrease widths of portions written into photoresists. One embodiment of the method includes projecting an initial light beam of a plurality of light beams at a minimum wavelength to a mask in a propagation direction of the plurality of light beams. The mask has a plurality of dispersive elements. A wavelength of each light beam of the plurality of light beams is increased until a final light beam of the plurality of light beams is projected at a maximum wavelength. The plurality of dispersive elements of the mask diffract the plurality of light beams into order mode beams to produce an intensity pattern in a medium between the mask and a substrate having a photoresist layer disposed thereon. The intensity pattern having a plurality of intensity peaks writes a plurality of portions in the photoresist layer.

Figure 1:
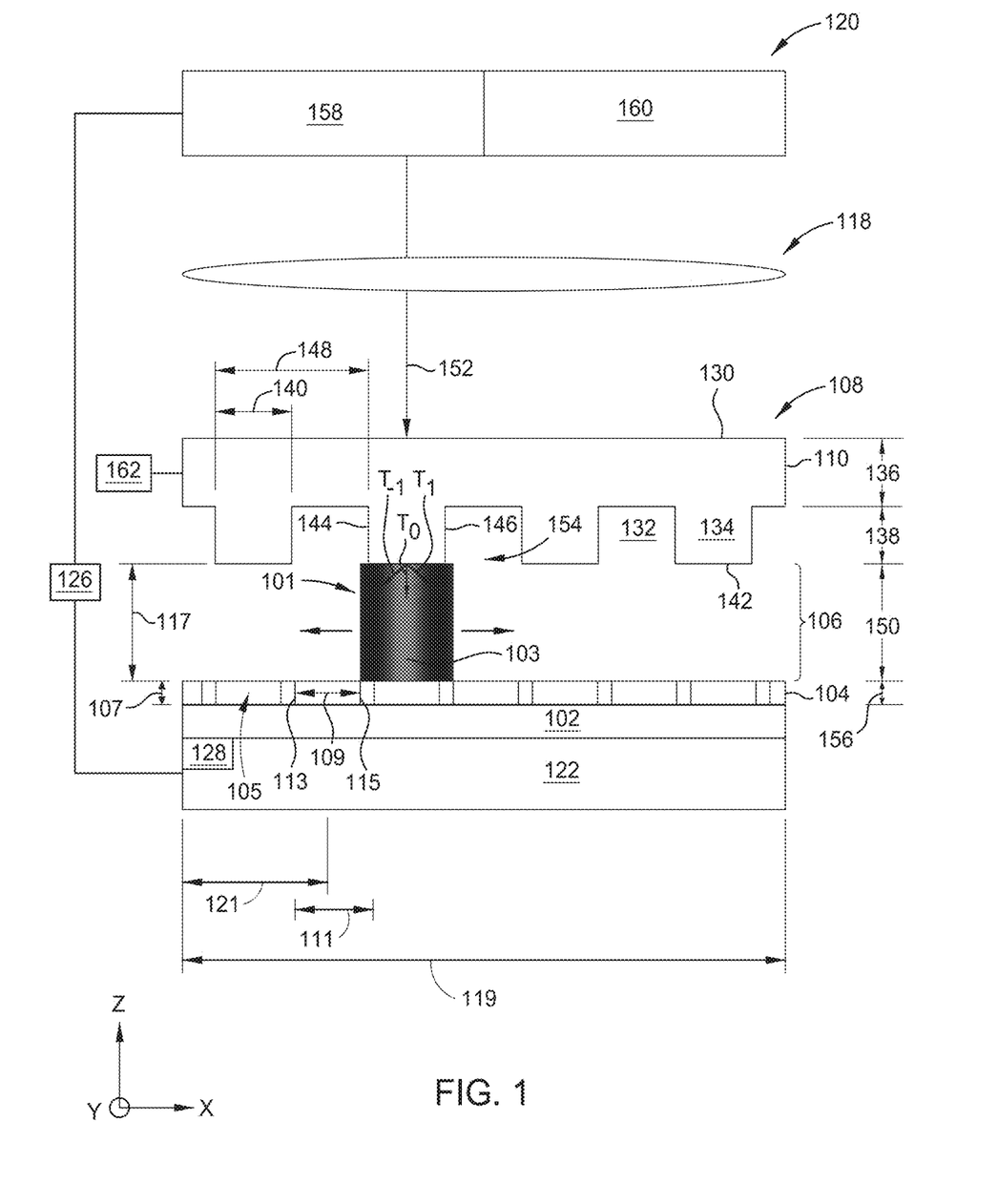
FIG. 1 is a schematic view of a system according to an embodiment.

FIG. 1 is a schematic view of a system 100, such as a lithography system, that may benefit from embodiments described herein. The system 100 includes a stage 122, one or more light sources 120, and a mask 108. A substrate 102 is supported by the stage 122. In one embodiment, which can be combined with other embodiments described herein, the one or more light sources 120 are have a projection area smaller than a surface area of the mask 108. The mask 108 is coupled to an actuator 162 configured to move the mask 108 in an X direction and/or Y direction to position the mask 108 in relation to the one or more light sources 120 and the substrate 102. In another embodiment, which can be combined with other embodiments described herein, the one or more light sources 120 have a projection area smaller than a surface area the substrate 102. The stage 122 is configured move in an X direction and/or Y direction to position the substrate 102 in relation to the one or more light sources 120 and the mask 108. However, embodiments of the method described herein do not necessitate movement of the stage 122 or the mask 108 when the projection area of the one or more light sources 120 is not less than the surface area of the substrate 102 and the surface area of the mask 108.

In one embodiment, which can be combined with other embodiments described herein, the stage 122 is further configured to tilt so that the substrate 102 is positioned at an angle relative to the x-axis, y-axis, or both the x-axis and y-axis of the mask 108. In one embodiment, an encoder 128 is coupled to the stage 122 in order to provide information of the location of the stage 122 to a controller 126. In another embodiment, which can be combined with other embodiments described herein, the encoder 128 includes a photo detector array that can measure the intensity of the light transmitted from the mask 108. The controller 126 may be coupled to or in communication with the stage 122 and the one or more light sources 120. The controller 126 is generally designed to facilitate the control and automation of the method described herein. The controller 126 may be coupled to or in communication with the stage 122 and the one or more light sources 120. The one or more light sources 120 and the encoder 128 may provide information to the controller 126 regarding substrate processing and substrate aligning. For example, the one or more light sources 120 may provide information to the controller 126 to alert the controller 126 that substrate processing has been completed.

The substrate 102 comprises any suitable material, for example, glass, which is used as part of a flat panel display. In other embodiments, which can be combined with other embodiments described herein, the substrate 102 is made of other materials capable of being used as a part of the flat panel display. For example, the materials include plastic or colorless polyimide. The substrate 102 has a film layer to be patterned formed thereon, such as by pattern etching thereof, and a photoresist layer 104 formed on the film layer to be patterned, which is sensitive to electromagnetic radiation, for example UV or deep UV "light". In one embodiment, which can be combined with other embodiments described herein, the photoresist layer 104 is a positive photoresist. A positive photoresist includes portions of the photoresist, when exposed to radiation, are respectively soluble to a photoresist developer applied to the photoresist after the pattern is written into the photoresist using the electromagnetic radiation. In one embodiment, which can be combined with other embodiments described herein, the photoresist layer 104 is a negative photoresist. A negative photoresist includes portions of the photoresist, when exposed to radiation, will be respectively insoluble to photoresist developer applied to the photoresist after the pattern is written into the photoresist using the electromagnetic radiation. The chemical composition of the photoresist layer 104 determines whether the photoresist is a positive photoresist or negative photoresist. Examples of photoresists include, but are not limited to, at least one of diazonaphthoquinone, a phenol formaldehyde resin, poly(methyl methacrylate), poly (methyl glutarimide), and SU-8. After exposure of the photoresist layer 104 to the electromagnetic radiation, the photoresist is developed to leave a patterned photoresist on the underlying film layer. In another embodiment, which can be combined with other embodiments described herein, the photoresist layer 104 is a dual tone photoresist. The dual tone resist has two threshold intensities. Below and above the two threshold intensities the dual tone resist functions as a positive photoresist and negative photoresist respectively and vice versa. Then, using the patterned photoresist, the underlying thin film is pattern etched through the openings in the photoresist. In one embodiment, the underlying thin film pattern etched forms optical components, such as a wire grid polarizer or a frequency selective surface, or portions of the electronic circuitry of the display panel.

Each one or more light source assemblies may be mounted at a different incident angles so that the mask 108 is illuminated in a conical manner. Each of the one or more light sources 120 is operable to emit one or more light beams 152. As shown FIG. 1, the one or more light sources 120 include a first light source 158 and a second light source 160. While the first light source 158 and the second light source 160 are shown in FIG. 1, the system 100 may include additional light sources 120. Each light beam 152 has a central wavelength $\lambda$. In one embodiment, which can be combined with other embodiments described herein, the central wavelength $\lambda$ is about 10 nanometers (nm) to about 632 nm. An emission spectrum of the light source 120 has a fractional bandwidth. The fractional bandwidth is a ratio of the wavelength spread of the central wavelength $\lambda$ expressed as a percentage. In one embodiment, which can be combined with other embodiments described herein, the fractional bandwidth is about 0.01% to about 20%. The central wavelength $\lambda$ includes wavelength-dependent intensity with at a spatial intensity profile. In one embodiment, the light beams 152 are coherent. In another embodiment the light beams 152 are incoherent. In another embodiment, the spatial intensity profile is a triangular profile, trapezoidal profile, exponential, uniform, or Gaussian profile. In one embodiment, which can be combined with other embodiments described herein, the one or more light beams 152 are projected from the one or more light sources 120 including a polarizing device, such as a polarizer, to project the one or more light beams 152 as transverse electric (TE) polarized light, transverse magnetic (TM) polarized light, and/or unpolarized light, such as partial polarized light. In one embodiment, which can be combined with other embodiments described herein, each light source of the one or more light sources 120 are coupled to a phase delay driver, such as a random phase delay driver and constant phase delay driver.

In one embodiment, which can be combined with other embodiments described herein, the one or more light sources 120 are broad diode, laser diodes, a phosphor, a photo luminance or an electro luminance from poly dispersed quantum dots (QDs), and/or broad band emitting quantum wells. In another embodiment, which can be combined with other embodiments described herein, the one or more light sources include non-linear materials that enable harmonic, sum, and/or difference frequency generations, materials that enable stoke and anti-stoke shift, and/or pulsars. In yet another embodiment, which can be combined with other embodiments described herein, the one or more light sources produce a plasma discharge distribution and the desired spectrum to be shaped using optical elements. In one embodiment, which can be combined with other embodiments described herein, the one or more light sources 120 may include one or more beam shaping optics 118. In one embodiment, which can be combined with other embodiments described herein, each light source of the one or more light sources 120 corresponds of a light beam of the one or more light beams 152. For example, the first light source 158 is operable to emit a first light beam and the second light source 160 is operable to emit a second light beam of the one or more light beams 152. In one embodiment, which can be combined with other embodiments described herein, each light beam 152 has the fractional bandwidth of about 0.01% to about 20% of the central wavelength $\lambda$. The emission spectrum may vary by about 1 nm to about 20 nm at a wavelength-dependent intensity. The broadband light source may be a laser diode. Each beam shaping optic of the one or more beam shaping optics 118 includes at least one spectral module and at least one spatial module. In one embodiment, which can be combined with other embodiments described herein, the spectral and spatial module can be integrated in the light source 120. The spectral module filters the broadband light at the emission spectrum to a spectral emission profile. In one embodiment, which can be combined with other embodiments described herein, the spectral emission profile is from about 0.01 nanometers (nm) to about 20 nm. The spatial module filters the intensity spectrum of the light at the spectral emission profile to a spatial intensity profile.

In one embodiment, which can be combined with other embodiments described herein, the mask 108 is over the substrate 102. The mask 108 is disposed over the photoresist layer 104 of the substrate 102 with a medium 106 between the mask 108 and the photoresist layer 104. The mask 108 includes body 110 having a first surface 130 and a second surface 132 with a plurality of dispersive elements 134 disposed thereon. The body 108 has a first thickness 136 from the first surface 130 to a second surface 132. Each dispersive element 134 has a height 138 and width 140. The height 138 is from the second surface 132 to a top surface 142 of the dispersive element 134. The width 140 is from a first sidewall 144 to a second sidewall 146 of the dispersive element 134. A pitch 148 is a distance between first sidewalls 144 of adjacent dispersive elements 134. A first duty cycle is determined by dividing the width 140 by the pitch 148. In one embodiment, which can be combined with other embodiments described herein, as shown in FIG. 1, the top surface 142 of each of the dispersive elements 134 is oriented toward to photoresist layer 104 with a distance 150 between the top surface 142 and the photoresist layer 104. In another embodiment, which can be combined with other embodiments described herein, the first surface 130 of the body 110 is oriented toward to the photoresist layer 104 with the distance 150 between the first surface 130 and the photoresist layer 104.

The body 110 and the plurality of dispersive elements 134 of the mask 108 consists of transparent materials of at least one of glass, silicon oxycarbide (SiOC), titanium dioxide (TiO$_2$), silicon dioxide (SiO$_2$), vanadium (IV) oxide (VO$_x$), aluminum oxide (Al$_2$O$_3$), indium tin oxide (ITO), zinc oxide (ZnO), tantalum pentoxide (Ta$_2$O$_5$), silicon nitride (S$_i$3N$_4$), titanium nitride (TiN), and zirconium dioxide (ZrO$_2$) containing materials. The body 110 has a first refractive index and the plurality of dispersive elements 134 has a second refractive index. In one embodiment, which can be combined with other embodiments described herein, the first refractive index and second refractive index are different. For example, the second refractive index may be greater than the first refractive index by the plurality of dispersive elements 134 including a second composition of transparent materials with a greater refractive index than a first composition of transparent materials of the body 110. The medium 106 may be air having a refractive index of 1.0 or other materials, such as oil, having a refractive index greater than air. In one embodiment, which can be combined with other embodiments described herein, each of the dispersive elements 134 may be a periodic in one, two, or three dimensions, quasi periodic, or aperiodic. In another embodiment, which can be combined with other embodiments described herein, each of the dispersive elements 134 may represent diffractive optical elements, e.g., a wire grid polarizer, a photonic crystal, an optical buffer, and/or a frequency selective filter.

Figure 2:
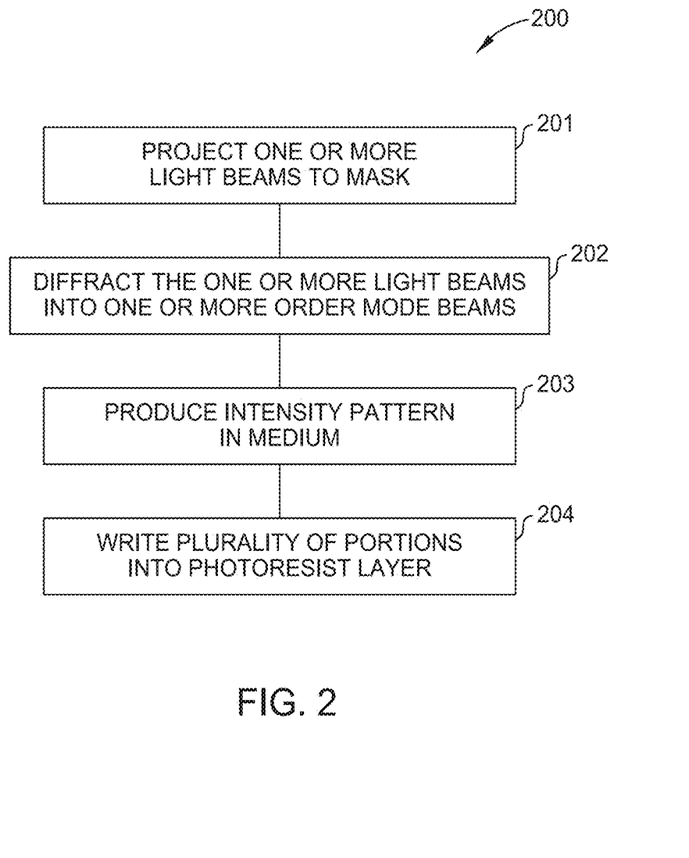
FIG. 2 is a flow diagram of a method of large area lithography according to an embodiment.

FIG. 2 is a flow diagram of a method 200 of large area lithography. In one embodiment, which can be combined with other embodiments described herein, system 100 is utilized for the method 200. It is to be understood that the system is an exemplary system and other system, including system from other manufacturers, may be used with or modified to accomplish aspects of the present disclosure. At operation 201, one or more light beams 152 are projected to a mask 108. Each light beam 152 has a central wavelength $\lambda$. At operation 202, the mask 108 receives the one or more light beams 152 and diffracts the incident light beams 152 into one or more order modes beams 154. Each of the plurality of dispersive elements 134 receives incident light beams 152 and diffracts the incident light beams 152 into one or more order modes beams 154. In one embodiment, which can be combined with other embodiments described herein, the one or more order modes beams 154 include zero-order mode (T$_0$) beams, first-order mode (T$_1$) beams, and negative first-order mode (T$_{-1}$) beams. In another embodiment, which can be combined with other embodiments described herein, the one or more order modes beams 154 include T$_0$ beams, T$_1$ beams, T$_{-1}$ beams, second-order mode (T$_2$) beams, and negative second-order mode (T$_{-2}$) beams.

Figure 3A:
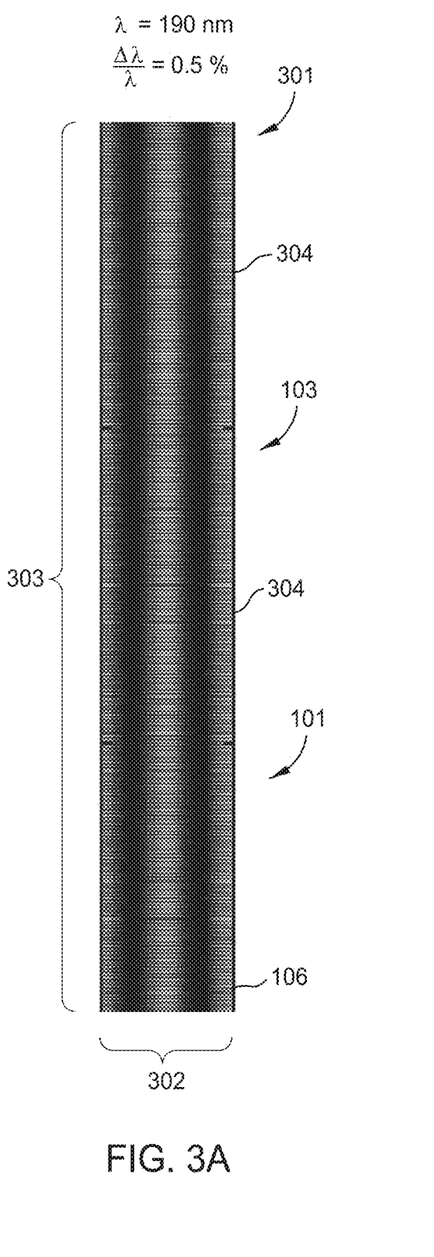
FIG. 3A illustrates a period of an intensity pattern in a medium according to an embodiment.

At operation 203, the one or more order modes beams 154 produce an intensity pattern 101 in the medium 106. The intensity pattern 101 includes a plurality of intensity peaks 103 repeated periodically in a propagation distance 117 of the medium 106 by a plane, described in further detail herein. A period 121 of the intensity pattern 101 is repeated periodically in the medium 106 in a traverse distance 119 across the photoresist layer 104. At operation 204, in the medium 106 each intensity peak of the plurality of intensity peaks 103 that contacts the photoresist layer 104 writes a portion of a plurality of portions 105 into the photoresist layer 104. Prior to exposure of the resist, the intensity can be mapped using the photo detector. Each portion of the plurality of portions 105 has a height 107, a width 109, and a sub-period 111. The height 107 corresponds to a thickness 156 of the photoresist layer 104. The width 109 is a distance between a first edge 113 and a second edge 115 of the portion. The sub-period 111 is a distance between adjacent first edges 113. In another embodiment, which can be combined with other embodiments described herein, the width 109 of at least one portion of the plurality of portions 105 is different within one period 121. In one embodiment, which can be combined with other embodiments described herein, the photoresist layer 104 includes at least one of at least one of ZEP, polymethyl methacrylate (PMMA), PI, and AZ resist materials. In one embodiment, which can be combined with other embodiments described herein, a bottom anti-reflective coating (BARC) disposed over the substrate 102. A hard mask layer may be disposed on the substrate 102. The hard mask layer includes at least one of Cr, SiOC, TiO$_2$, SiO$_2$, VO$_x$, Al$_2$O$_3$, ITO, ZnO, Ta$_2$O$_5$, S$_i$3N$_4$, TiN, and ZrO$_2$ materials. FIG. 3A illustrates a lateral pattern 301 of the intensity pattern 101 in the medium 106.

Figure 3B:
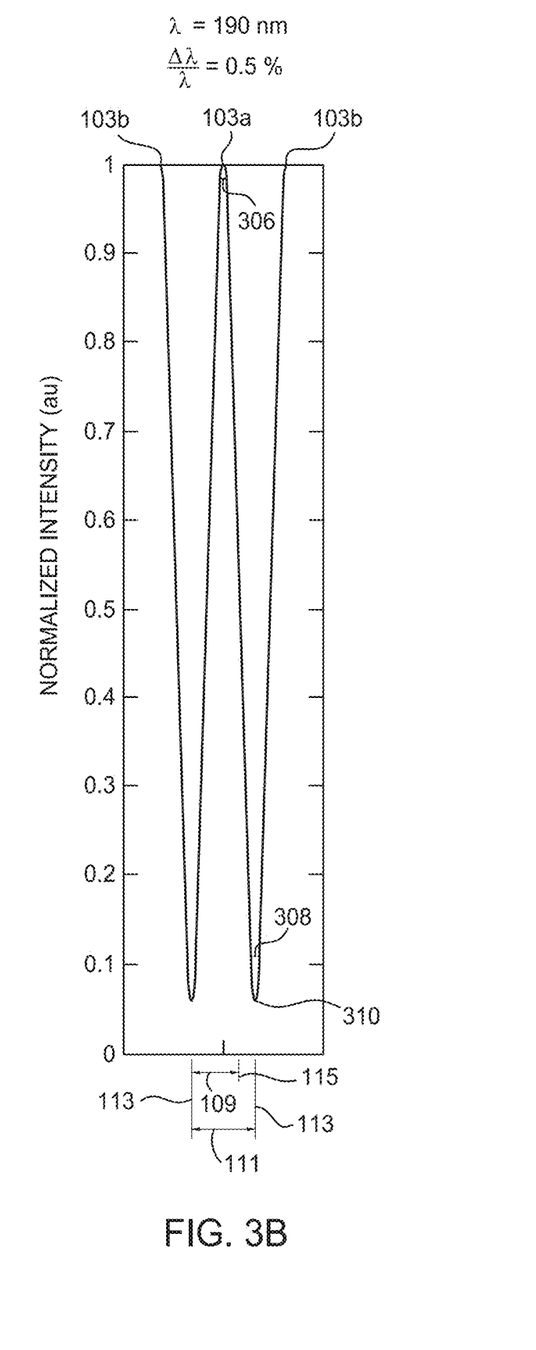
FIG. 3B illustrates a normalized line intensity of a plane of a lateral pattern of an intensity pattern according to an embodiment.

In one embodiment, which can be combined with other embodiments described herein, the intensity pattern 101 is generated by one or more light beams 152 having a central wavelength λ of about 190 nm and fractional band width of about 0.5%. The lateral pattern 301 is repeated periodically in the medium 106 in a traverse distance 302 across the length of the photoresist layer 104. The lateral pattern 301 may include two or more sub-periods 111 including the width 109. The plurality of intensity peaks 103 is repeated periodically in a propagation distance 303 from the mask 108 across the medium 106 by a plane 304. The plane 304 is repeated with a spacing of $λ/\sqrt{(1-(1-(λ^2/d^2))}$ for monochromatic light along the propagation direction of the transmitted light. The plane 304 is also known as a Talbot plane. The intensity peaks 103 are displaced by one half period with respect to each other at odd and even multiples of Talbot planes. For polychromatic light, the plane 304 is a resultant from the interference of individual wavelengths in which an image independent of the light propagation direction is observed at Zm. The images independent of the light propagation direction tend to have spatial frequency greater than mask 108 and repeat with a spacing of about $(d^2Δλ)/λ^2$, where λ is the central wavelength λ of the light beams 152, Δλ is the difference in the minimum and maximum of the light beams 152, and d is the pitch 148 of the dispersive element 134 of the mask 108. FIG. 3B illustrates a normalized line intensity of the plane 304 of the lateral pattern 301 of the intensity pattern 101. In one embodiment, which can be combined with other embodiments described herein, one of the planes 304 is located at about 100 micrometers (μm). The plane 304 includes one or more intensity peaks 103, e.g., 103a, 103b and 103c. The width 306 of the intensity peak 103 corresponds to the width 109 a portion of the plurality of portions 105. A width 308 of an intensity minimum 310 and the width 306 correspond to the sub-period 111 of the portion of the plurality of portions 105. In order decrease the width 109 and control the sub-period 111, the number of the intensity peaks 103 must increase in the plane 304. In order decrease the width 109 and control the sub-period 111, a contrast ratio between the intensity peak maximum (103a, 103b and/or 103c) and the intensity minimum 310 should be maximized. The contrast ratio is defined as ratio of the difference in the intensity maximum (103a, 103b or 103b) and the intensity minimum 310 to the sum of the intensity maximum and minimum. The embodiments described herein, which can be combined with other embodiments described herein, utilize a plurality of light beams 152 that are incoherent or partially coherent.

Figure 4A:
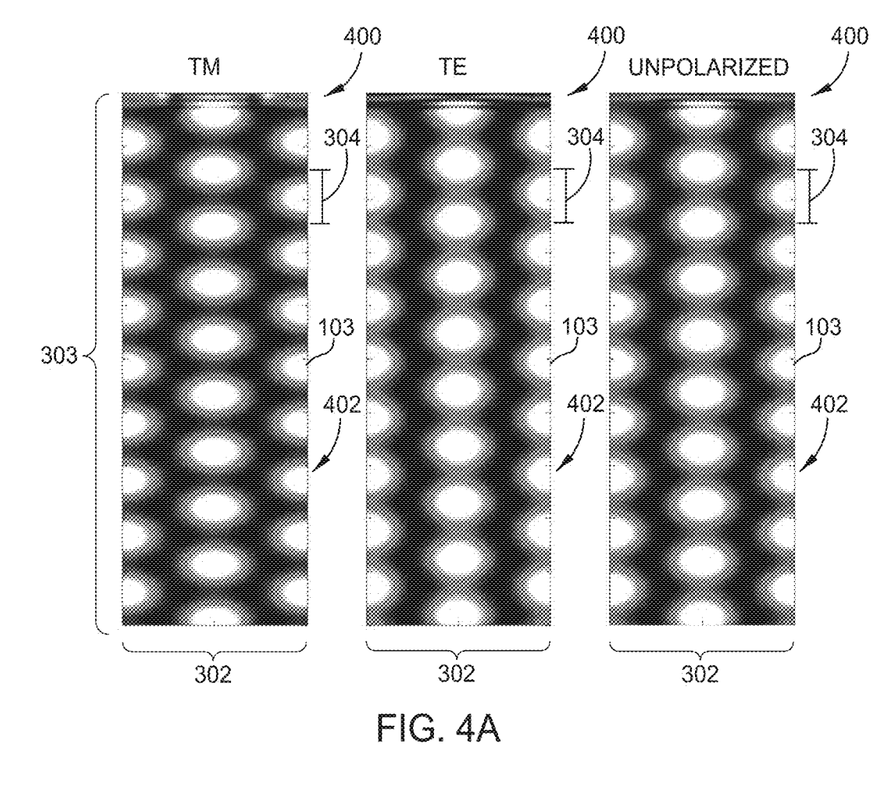
FIG. 4A illustrates portions corresponding to a period of an intensity pattern in a medium according to an embodiment.

In one embodiment, which can be combined with other embodiments described herein, to increase the number of pronounced intensity peaks 103 and/or increase the contrast ratio in the plane 304 a plurality of light beams 152 is projected to the mask 108 with at least one light beam 152 having a different polarization. FIG. 4A illustrates portions 400 corresponding to a lateral pattern 301 of the intensity pattern 101 in the medium 106. In one embodiment, which can be combined with other embodiments described herein, the portion 400 is an intensity pattern 402 of TM polarized light beams 152. In another embodiment, which can be combined with other embodiments described herein, the portion 400 is an intensity pattern 404 of TE polarized light beams 152. In yet another embodiment, which can be combined with other embodiments described herein, the portion 400 is an intensity pattern 402 of unpolarized light beams 152, i.e. partially polarized light beams. The lateral pattern 301 is repeated periodically in the medium 106 in the traverse distance 302. The plurality of intensity peaks 103 is repeated periodically in a propagation distance 303 by the plane 304. As shown in FIG. 4A, the TM polarized light beams 152, the TE polarized light beams 152, and the unpolarized light beams 152 displaces the plurality of intensity peaks 103 longitudinally in the propagation distance 303. To decrease the width 109 and control the sub-period 111 the plurality of light beams 152 is projected to the mask 108 with at least one light beam 152 having a different polarization to increase the number of pronounced intensity peaks 103 and/or increase the contrast ratio in the plane 304.

In one embodiment, which can be combined with other embodiments described herein, the first light source of the one or more light sources 120 projects a first light beam of the plurality of light beams 152. The first light beam has a first polarization of one of a TE polarization, a TM polarization, and an unpolarized polarization. The second light source of the one or more light sources 120 projects a second light beam of the plurality of light beams 152. The second light beam has a second polarization of one of the TE polarization, the TM polarization, and the unpolarized polarization different than the first polarization. Additional light sources of the one or more light sources 120 may project light beams of the plurality of light beams 152. Each light beam has a polarization of one of the TE polarization, the TM polarization, and the unpolarized polarization different than at least one of the first polarization and second polarization. In one embodiment, which can be combined with other embodiments described herein, the first light source, the second light source, and the additional light sources of the one or more light sources 120 project at substantially the same time. In one embodiment, which can be combined with other embodiments described herein, the first light source, the second light source, and the additional light sources of the one or more light sources 120 project at different times.

Figure 4B:
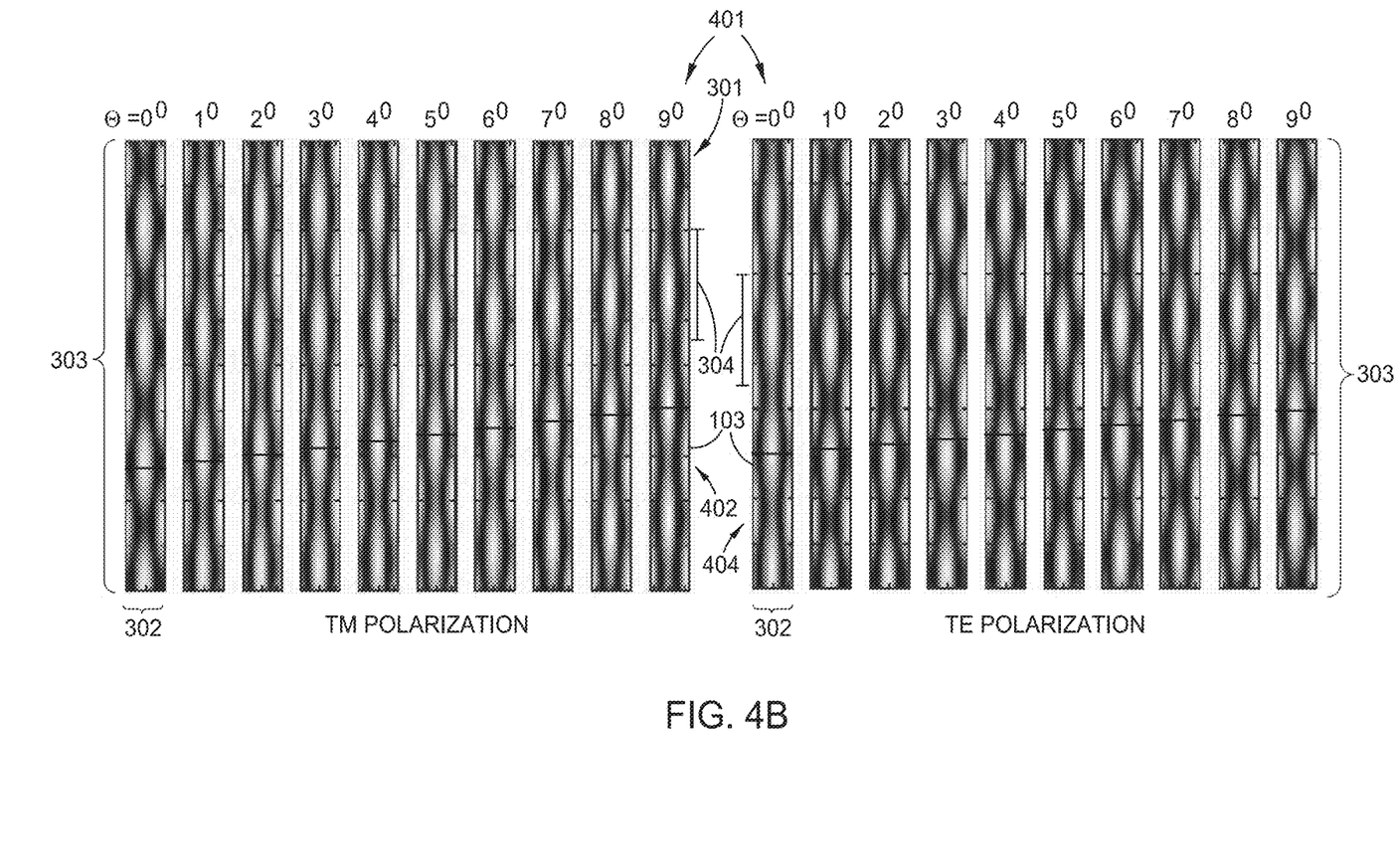
FIG. 4B illustrates portions corresponding to a period of an intensity pattern in a medium according to an embodiment.

FIG. 4B illustrates portions 401 corresponding to the lateral pattern 301 of the intensity pattern 101 in the medium 106. In one embodiment, which can be combined with other embodiments described herein, each portion 401 is the intensity pattern 402 of TM polarized light beams 152. In another embodiment, which can be combined with other embodiments described herein, the each portion 401 is the intensity pattern 404 of TE polarized light beams 152. As shown in FIG. 4B, the angle of incidence ⊖ displaces the plurality of intensity peaks 103 longitudinally in the propagation distance 303. To decrease the width 109 and control the sub-period 111 the plurality of light beams 152 is projected to the mask 108 with at least one light beam 152 having an angle of incidence ⊖ to increase the number of intensity peaks 103 in the plane 304. In one embodiment, which can be combined with other embodiments described herein, the one or more light sources 120 may be mounted at a different incident angles so that the mask 108 is illuminated with light beams 152 having different angles of incidence ⊖. For example, the one or more light sources 120 are arranged in a conical manner. In another embodiment, which can be combined with other embodiments described herein, each of the one or more light sources 120 are coupled to a random phase delay driver to longitudinally displace the plurality of intensity peaks 103 in the propagation distance 303.

Figure 4C:
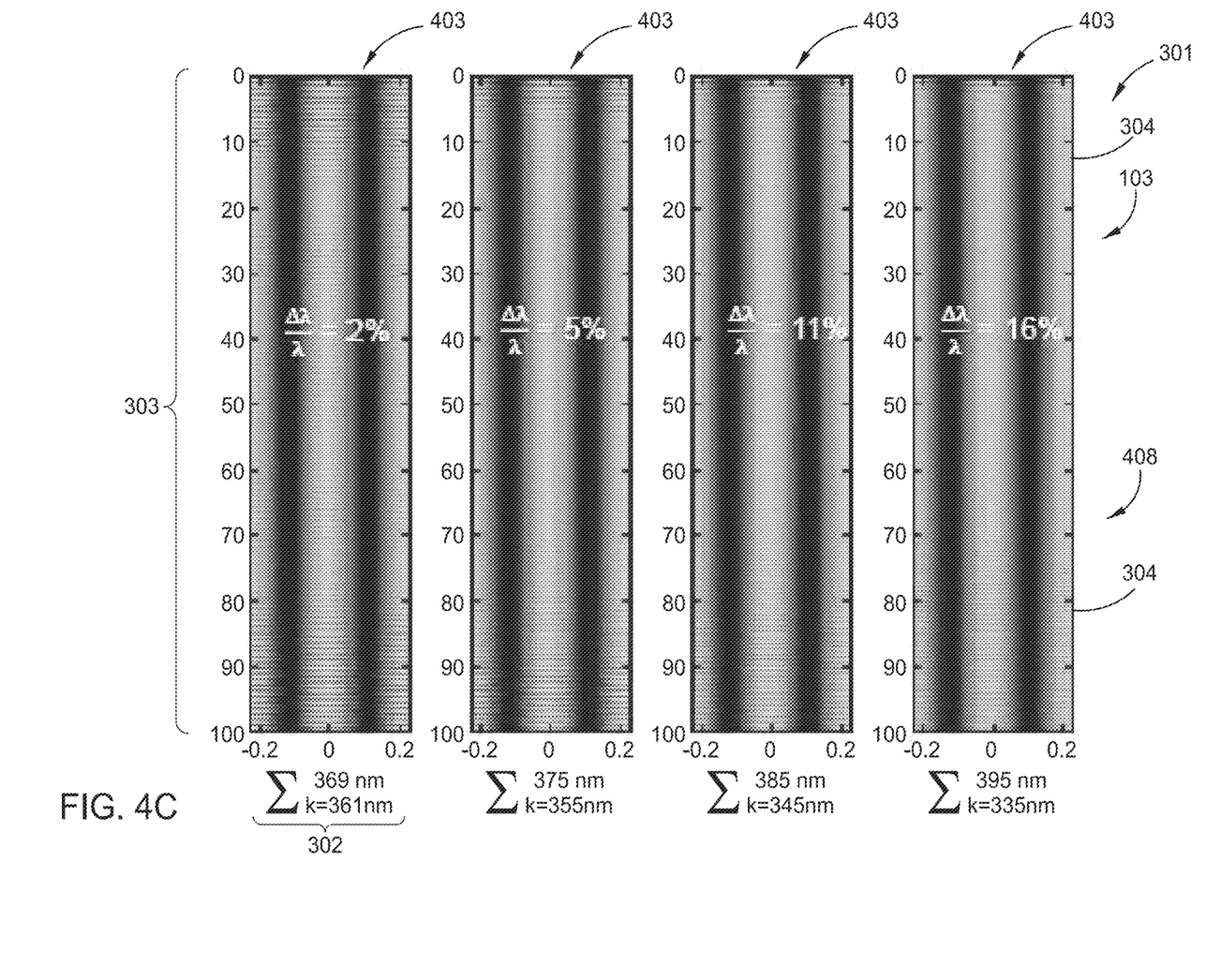
FIG. 4C illustrates portions corresponding to a lateral pattern of an intensity pattern in a medium according to an embodiment.
Figure 4D:
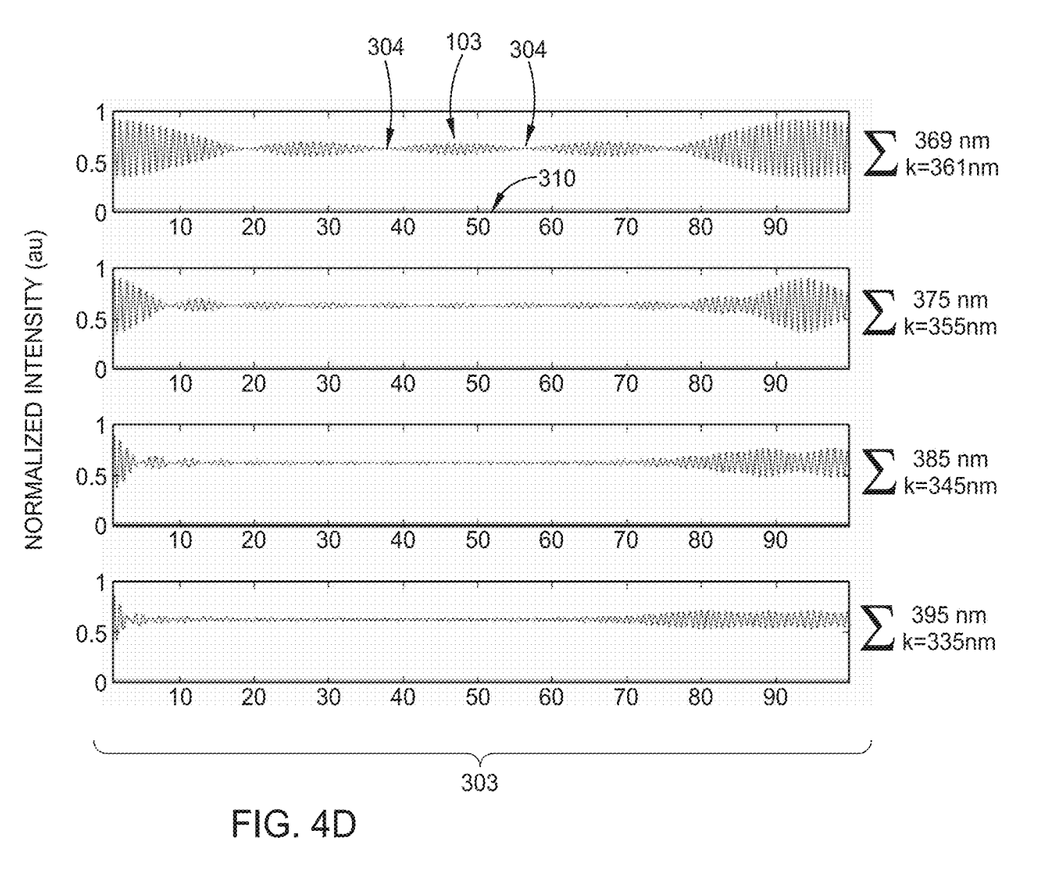
FIG. 4D illustrates normalized intensities pattern of plurality of intensity peaks of the portions in the propagation distance according to an embodiment.

In one embodiment, which can be combined with other embodiments described herein, to increase the number of intensity peaks 103 and/or increase the contrast ratio in the plane 304 an incoherent plurality of light beams 152 is projected to the mask 108. FIG. 4C illustrates portions 403 corresponding to a lateral pattern 301 of the intensity pattern 408 in the medium 106. FIG. 4D illustrates normalized intensities of the plurality of intensity peaks 103 of the portions 403 in the propagation distance 303. The intensity patterns 408 of the portions 403 are formed from projecting an initial light beam of a plurality of light beams 152 at a minimum wavelength $\lambda_{min}$ and increasing a wavelength $\lambda$ of each light beam of the plurality of light beams 152 until a final light beam of the plurality of light beams 152 is projected at a maximum wavelength $\lambda_{max}$. In one embodiment, which can be combined with other embodiments described herein, the first light source 158 is operable to emit a first light beam having the minimum wavelength $\lambda_{min}$ and the second light source 160 is operable to emit a second light having the maximum wavelength $\lambda_{max}$. Additional light sources of the one or more light sources 120 projects light beams 152 having a different wavelength $\lambda$ not less than the minimum wavelength $\lambda_{min}$ and not greater than the maximum wavelength $\lambda_{max}$. The fractional bandwidth, i.e., difference $\Delta\lambda$ of the maximum wavelength $\lambda_{max}$ to the minimum wavelength $\lambda_{min}$ divided by the central wavelength $\lambda$, is about 0.01% to about 20%. As shown in FIG. 4D the number of intensity peaks 103 and/or the contrast ratio are increased in the plane 304.

Figure 4E:
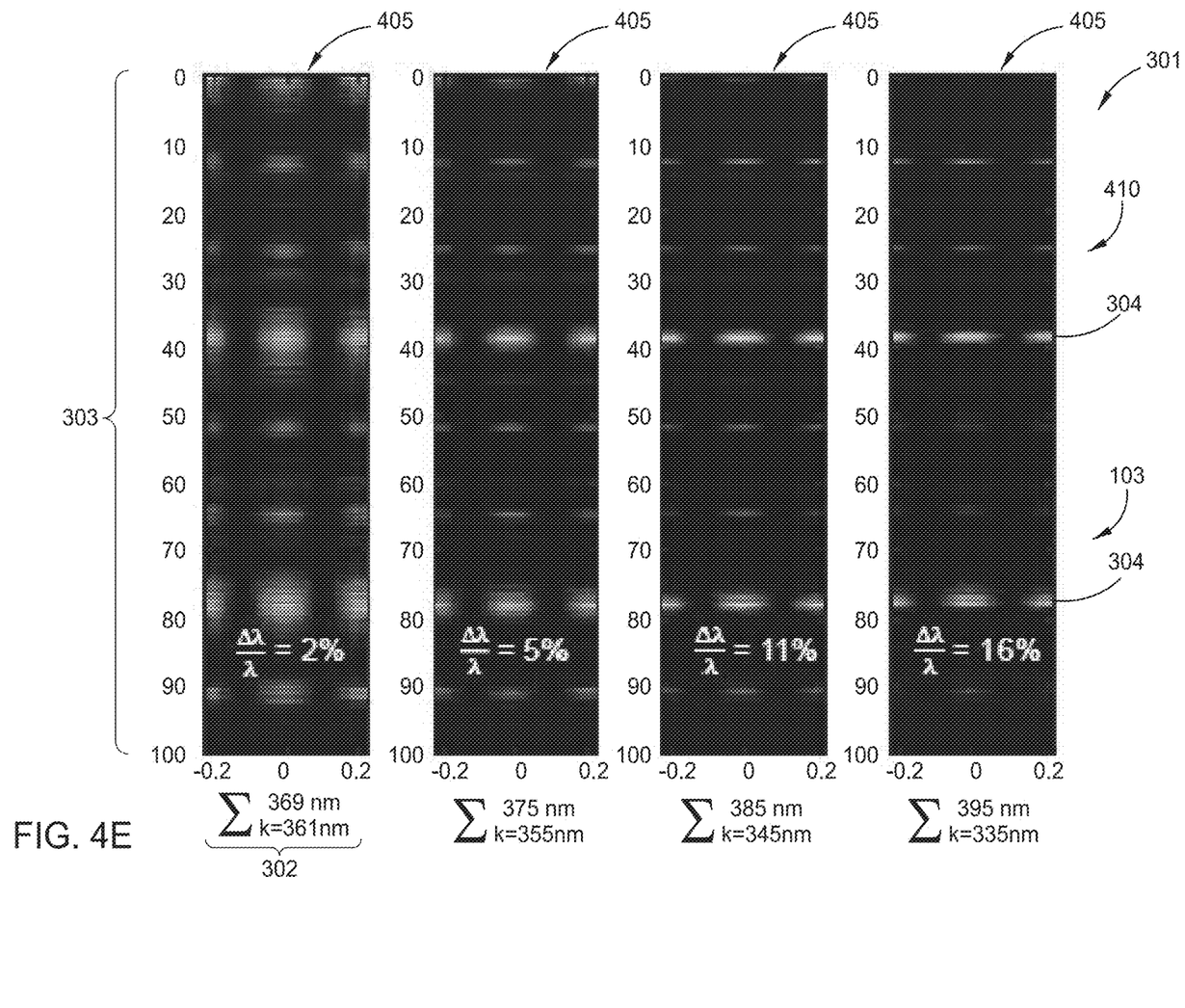
FIG. 4E illustrates portions corresponding to a lateral pattern of an intensity pattern in a medium according to an embodiment.
Figure 4F:
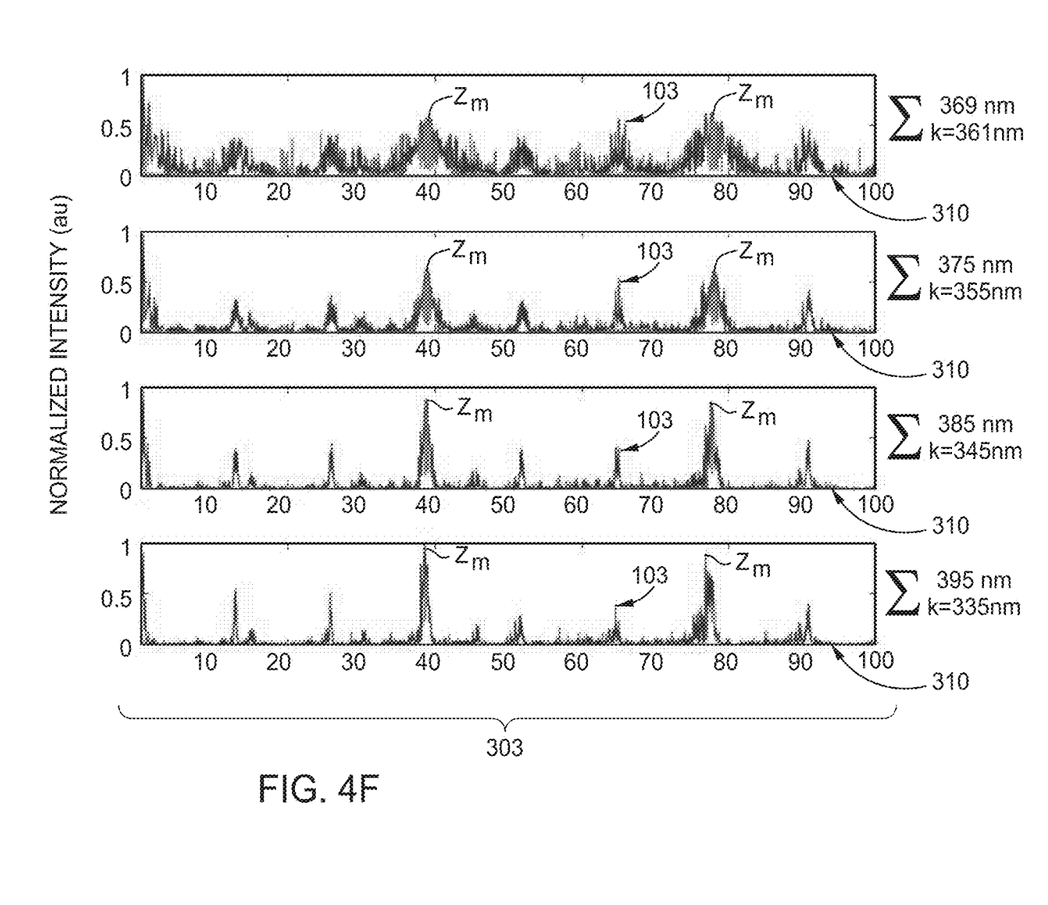
FIG. 4F illustrates normalized intensities of plurality of intensity peaks of the portions in the propagation distance according to an embodiment.

FIG. 4E illustrates portions 405 corresponding to a lateral pattern 301 of the intensity pattern 101 in the medium 106. FIG. 4F illustrates normalized intensities of the plurality of intensity peaks 103 of the portions 405 in the propagation distance 303. The intensity patterns 410 of the portions 405 is formed from projecting a plurality of light beams 152 at the same time with each light beam of the plurality of light beams 152 having a different central wavelength $\lambda$ not less than a minimum wavelength $\lambda$min and not greater than at a maximum wavelength $\lambda$max of the plurality of wavelengths. In one embodiment, which can be combined with other embodiments described herein, the first light source 158 is operable to emit a first light beam having the minimum wavelength $\lambda$min and the second light source 160 is operable to emit a second light having the maximum wavelength $\lambda$max. Additional light sources of the one or more light sources 120 projects light beams 152 having a different wavelength $\lambda$ not less than a minimum wavelength $\lambda$min and not greater than at a maximum wavelength $\lambda$max. A difference $\Delta\lambda$ of the maximum wavelength $\lambda$max to the minimum wavelength $\lambda$min divided by the central wavelength $\lambda$ is about 0.01% to about 20%. As shown in FIG. 4F the number of intensity peaks 103 are increased in the plane 304. For the embodiments described herein the finite resist thickness, as thin as 100 nm, tends to increase the contrast ratio.

Due to the interference of multiple wavelengths, at some planes along the light propagation direction the resultant intensity pattern 408 is the average of the response of individual wavelengths with spatial frequency greater than the mask 108. The sub-period 111 and width 109 of the plurality of portions 105, will depend on the spatial and spectral properties of the input light source 120. At certain locations, for example 40 um and 80 um of the substrate 102 with a finite photoresist thickness, the contrast ratio is sufficient to enable line doubling resulting in intensity peaks $Z_m$. The line and space pattern transferred into the photoresist layer 104 has a period half than that of the line and the space pattern of the mask bearing features. At other locations of the substrate 102 and photoresist thickness it is possible to perform self-imaging, i.e., pattern in the photoresist layer 104, is same as that of the mask bearing features, or have patterns in the photoresist layer 104 that have the line and space different than the mask 108.

Figure 5A:
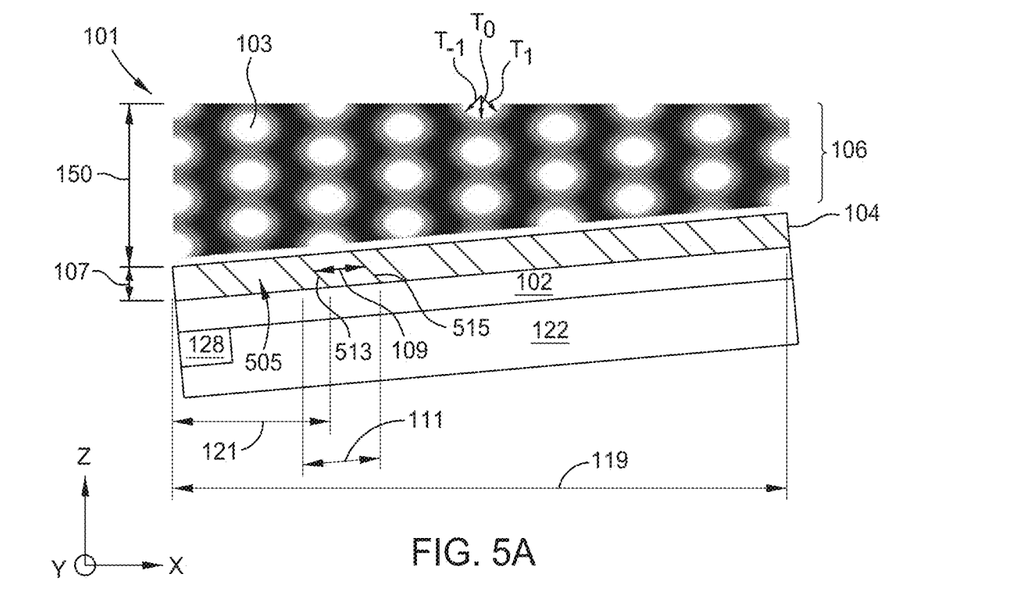
FIG. 5A is schematic view of a stage tilted at an angle relative to the x-axis of the mask according to an embodiment.

FIG. 5A is schematic view of a stage 122 tilted at an angle relative to the x-axis of the mask 108. In other embodiments, which can be combined with other embodiments described herein, the stage 122 is tilted at an angle relative to y-axis, or both the x-axis and y-axis of the mask 108. Tilting the stage 122 positions the substrate 102 at the angle relative to the x-axis, y-axis, or both the x-axis and y-axis of the mask 108 such that each intensity peak of the plurality of intensity peaks 103 that contacts the photoresist layer 104 writes a portion of a plurality of portions 505 into the photoresist layer 104. Each portion of the plurality of portions 105 has a height 107, a width 109, and a sub-period 111. A first edge 513 and the second edge 515 of portion of a plurality of portions 505 are angled as a result of positioning the substrate 102 at the angle relative to the x-axis of the mask 108.

Figure 5B:
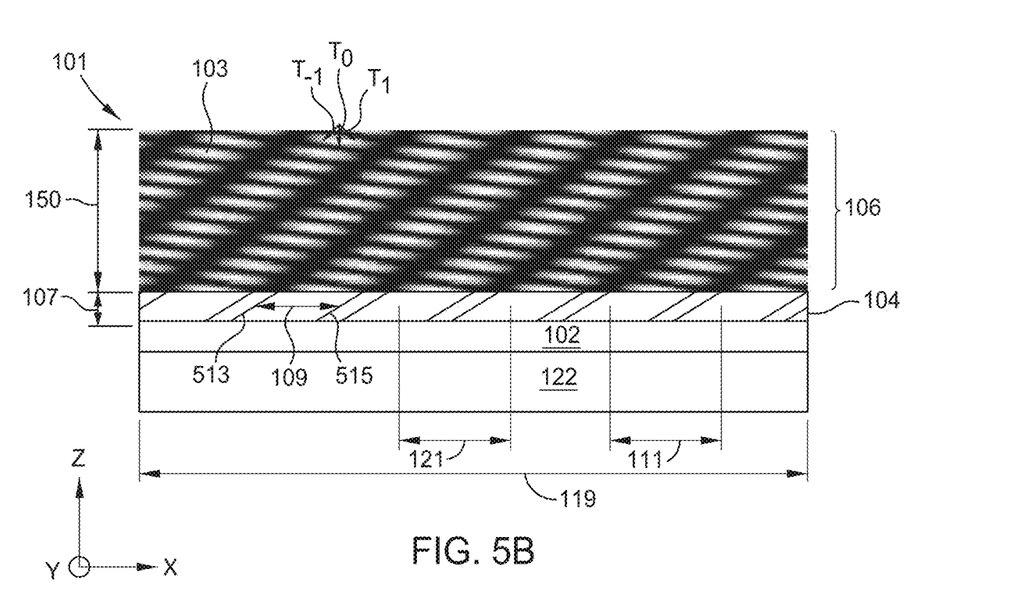
FIG. 5B is schematic view of a stage tilted at an angle relative to the x-axis of the mask according to an embodiment.

FIG. 5B schematic view of stage 122 parallel to the x-axis of the mask. The plurality of intensity peaks 103 of the intensity pattern 101 are arranged in a slanted pattern as a result the order mode beams 154 consisting of two consecutive order modes. For example, zero-order mode (T0) beams and one of first-order mode (T1) beams and negative first-order mode (T-1) beams. The zero-order mode (T0) beams and one of first-order mode (T1) beams and negative first-order mode (T-1) beams in the medium 106 are diffracted by at least angled dispersive elements 134 or by incorporating a phase telescope, a Bertrand lens, or a diaphragm. Each intensity peak of the plurality of intensity peaks 103 that contacts the photoresist layer 104 writes a portion of a plurality of portions 505 into the photoresist layer 104. Each portion of the plurality of portions 505 has a height 107, a width 109, and a sub-period 111. A first edge 513 and the second edge 515 of portion of a plurality of portions 505 are angled as a result of zero-order mode (T0) beams and one of first-order mode (T1) beams and negative first-order mode (T-1) beams.

In summation, a method of large area lithography to decrease widths of a plurality of portions written into a photoresist is described herein. The method of lithography enables large area sub-micron patterning of critical dimensions with high throughput and efficiency at low cost. The utilization of increasing the number of intensity peaks of a pattern in a Plane in a propagation distance in the medium between the mask and photoresist decreases the widths and control the pitches of the plurality of portions.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    projecting a first light beam of a plurality of light beams to a mask in a propagation direction of the plurality of light beams, the first light beam having a first polarization of one of:
        a transverse electric (TE) polarization;
        a transverse magnetic (TM) polarization; and
        a partial polarization;
    projecting a second light beam of the plurality of light beams to the mask, the second light beam having a second polarization different than the first polarization, the second polarization is one of:
        the TE polarization;
        the TM polarization; and
        the partial polarization;
    projecting an additional light beam of the plurality of light beams to the mask, the additional light beam having a third polarization different than one of the first polarization or the second polarization, the third polarization is one of:
        the TE polarization;
        the TM polarization; and
        the partial polarization; and wherein:
            a plurality of dispersive elements of the mask diffract the plurality of light beams into order mode beams to produce an intensity pattern in a medium between the mask and a substrate having a photoresist layer disposed thereon;
            the intensity pattern includes a plurality of intensity peaks defined by sub-periodic patterns repeated with a spatial frequency greater than a frequency of the dispersive elements, the sub-periodic patterns repeated with a spacing proportional to a pitch of at least one of the dispersive elements; and
            the intensity peaks of the sub-periodic patterns write a plurality of portions in the photoresist layer.

2. The method of claim 1, wherein:
    a first light source of a plurality of light sources projects the first light beam;
    a second light source of the plurality of light sources projects the second light beam; and
    an additional light source of the plurality of light sources project the additional light beam of the plurality of light beams.

3. The method of claim 2, wherein each of the plurality of light beams has different angles of incidence.

4. The method of claim 3, wherein each of the plurality of light sources is coupled to a phase delay driver.

5. The method of claim 3, wherein the plurality of light sources are mounted at different incident angles.

6. The method of claim 2, wherein each of the plurality of light sources include a polarizing device to project a light beam having one of:
    the TE polarization;
    the TM polarization; and
    the partial polarization.

7. The method of claim 1, wherein the order mode beams consists of zero-order mode beams and one of:
    first-order mode beams; and
    negative first-order mode beams.

8. The method of claim 1, wherein the substrate is tilted at an angle relative to at least one of:
    an x-axis of the mask;
    a y-axis of the mask; and
    both the x-axis and the y-axis of the mask.

9. A method, comprising:
    projecting an initial light beam of a plurality of light beams at a minimum wavelength to a mask in a propagation direction of the plurality of light beams; and
    increasing a wavelength of each light beam of the plurality of light beams until a final light beam of the plurality of light beams is projected at a maximum wavelength, wherein:
        the plurality of light beams include:
            a first light beam having a first polarization of one of a transverse electric (TE) polarization, a transverse magnetic (TM) polarization, and a partial polarization;
            a second light beam having a second polarization different than the first polarization, the second polarization is one of the TE polarization, the TM polarization; and the partial polarization; and
            an additional light beam having a third polarization different than one of the first polarization or the second polarization, the third polarization is one of the TE polarization, the TM polarization, and the partial polarization; and
        a plurality of dispersive elements of the mask diffract the plurality of light beams into order mode beams to produce an intensity pattern in a medium between the mask and a substrate having a photoresist layer disposed thereon, the intensity pattern having a plurality of intensity peaks defined by sub-periodic patterns repeated with a spatial frequency greater than a frequency of the dispersive elements, the sub-periodic patterns repeated with a spacing proportional to a pitch of at least one of the dispersive elements, the intensity peaks of the sub-periodic patterns write a plurality of portions in the photoresist layer.

10. The method of claim 9, wherein:
    an initial light source of a plurality of light sources projects the initial light beam;
    a final light source of the plurality of light sources projects the final light beam; and
    additional light sources of the plurality of light sources project additional light beams of the plurality of light beams, each of the additional light beams having a different wavelength not less than the minimum wavelength and not greater than the maximum wavelength.

11. The method of claim 10, wherein each of the plurality of light sources is coupled to a random phase delay driver.

12. The method of claim 10, wherein the plurality of light sources are mounted at different incident angles.

13. The method of claim 10, wherein the plurality of light sources include at least one of a broad diode, a laser diode, a phosphor, a photo luminance, an electro luminance, and a broad band emitting quantum well.

14. The method of claim 10, wherein the plurality of light sources comprises non-linear materials.

15. The method of claim 9, wherein the order mode beams consists of zero-order mode beams and one of:
first-order mode beams; and
negative first-order mode beams.

16. The method of claim 9, wherein the substrate is tilted at an angle relative to at least one of:
an x-axis of the mask;
a y-axis of the mask; and
both the x-axis and the y-axis of the mask.

17. A method, comprising:
projecting a plurality of light beams concurrently to a mask in a propagation direction of the plurality of light beams, each light beam of the plurality of light beams having a different wavelength not less than a minimum wavelength and not greater than a maximum wavelength of a plurality of wavelengths, wherein:
the plurality of light beams include:
a first light beam having a first polarization of one of a transverse electric (TE) polarization, a transverse magnetic (TM) polarization, and a partial polarization;
a second light beam having a second polarization different than the first polarization, the second polarization is one of the TE polarization, the TM polarization; and the partial polarization; and
an additional light beam having a third polarization different than one of the first polarization or the second polarization, the third polarization is one of the TE polarization, the TM polarization, and the partial polarization; and
a plurality of dispersive elements of the mask diffract the plurality of light beams into order mode beams to produce an intensity pattern in a medium between the mask and a substrate having a photoresist layer disposed thereon, the intensity pattern having a plurality of intensity peaks defined by sub-periodic patterns repeated with a spatial frequency greater than a frequency of the dispersive elements, the sub-periodic patterns repeated with a spacing proportional to a pitch of at least one of the dispersive elements, the intensity peaks of the sub-periodic patterns write a plurality of portions in the photoresist layer.

18. The method of claim 17, wherein:
a first light source of a plurality of light sources projects the first light beam of the plurality of light beams having the minimum wavelength;
a second light source projects the second light beam of the plurality of light beams having the maximum wavelength; and
an additional light source of the plurality of light sources project the additional light beam of the plurality of light beams, each of the additional light beams having a different wavelength not less than the minimum wavelength and not greater than the maximum wavelength.

19. The method of claim 18, wherein each of the plurality of light sources is coupled to a random phase delay driver.

20. The method of claim 17, wherein the plurality of light beams are concurrently projected by a plasma source operable to produce a plasma discharge distribution of light beams having the different wavelength not less than the minimum wavelength and not greater than the maximum wavelength of the plurality of wavelengths.

* * * * *